United States Patent [19]

Rallis

[11] Patent Number: 4,655,852
[45] Date of Patent: Apr. 7, 1987

[54] METHOD OF MAKING ALUMINIZED STRENGTHENED STEEL

[76] Inventor: Anthony T. Rallis, 5507 Beechwood, Midland, Tex. 79707

[21] Appl. No.: 766,604

[22] Filed: Aug. 16, 1985

Related U.S. Application Data

[63] Continuation-in-part of Ser. No. 672,176, Nov. 19, 1984, abandoned, which is a continuation of Ser. No. 501,260, Jun. 6, 1983, abandoned.

[51] Int. Cl.$^4$ ............................................. C23C 22/70
[52] U.S. Cl. .................... 148/6.11; 148/6.27; 148/14; 427/329; 427/374.4; 427/431; 427/398.1
[58] Field of Search .................. 148/6.11, 6.27, 14; 427/329, 398.1, 374.4, 431

[56] References Cited

U.S. PATENT DOCUMENTS

| | | | |
|---|---|---|---|
| 2,544,671 | 3/1951 | Grange et al. | 22/204 |
| 2,570,906 | 10/1951 | Alferieff | 117/51 |
| 2,797,476 | 7/1957 | Sendzimir | 29/528 |
| 4,056,366 | 11/1977 | Lee et al. | 29/653 |
| 4,070,210 | 1/1978 | Gierek et al. | 148/6.11 |

Primary Examiner—Norman Morgenstern
Assistant Examiner—Janyce A. Bell
Attorney, Agent, or Firm—Thomas L. Cantrell

[57] ABSTRACT

A steel article which is made of carbon or low alloy steel, with a prescribed chemical composition, is heat treated so that its yield strength is increased to a minimum of 60,000 psi and is subsequently dipped or spray covered with aluminum and then heated to interdiffuse aluminum metal and the iron in the steel matrix, thereby forming a new intermetallic layer which is an integral part of the steel article and which is essentially an aluminum-iron alloy, all in a manner which does not lower the yield strength of the steel below 60,000 psi. In the preferred form of the invention, a steel article is austenitized above its critical temperature for about 15 minutes or more and is subsequently rapidly cooled to below 600° F. to transform the austenite structure to a much stronger martensitic structure and is then reheated to below 1341° F. to temper the martensite. Aluminum is applied to the outer surface of the cleaned article by dipping in molten aluminum or otherwise, and the article is again reheated to above 1000° F. but below 1341° F. whereupon a substantial quantity of aluminum interdiffuses with the iron in the steel matrix, thereby forming a new intermetallic alloy layer. The interdiffusion process is carried out without reducing the yield strength level below 60,000 psi. This method provides an inexpensive, high-strength steel tool with enhanced corrosion resistance.

6 Claims, No Drawings

METHOD OF MAKING ALUMINIZED STRENGTHENED STEEL

This Application is a Continuation-in-Part of Ser. No. 672,176 entitled Method of Providing Corrosion Resistance Surface for Downhole Tools, filed Nov. 19, 1984 now abandoned, which in turn is a continuation of Ser. No. 501,260 entitled Method of Providing Corrosion Resistance Surface for Downhole Tools filed June 6, 1983 now abandoned.

BACKGROUND OF THE INVENTION

The present invention relates to a method of aluminizing a steel article while maintaining a relatively high yield strength and in particular it relates to products produced by such a method such as pump rods, tubing, valves, and other tools used in oil and gas wells where corrosive environments are encountered and where corrosion and high temperature resistance are desirable. The method of this invention can be practiced in conjunction with many tools which are made of carbon or low alloy steel that meet a prescribed chemical composition and special processing requirements described herein.

The various components of downhole production pumps and the rod string attached thereto must often operate under severe environmental conditions. Presently, carbon or low alloy steels used to make these downhole tools often fail prematurely when operating in a corrosive environment. This is very costly because of loss of production as well as the enormous expense of equipment and labor required to carry out such an operation. Moreover, the use of recognized corrosion resistant materials, such as stainless steels, nickel alloys, and other costlier materials, make drilling and producing a well extremely expensive, and many of these materials do not possess sufficient strength to operate in wells where high stresses are encountered.

Where a corrosive well requires the use of steel tools, and in order to maintain sufficient structural integrity of the tool, a corrosion inhibitor is often injected into the downhole fluid in an effort to provide a protection against corrosive environments. In many of these wells, however, higher bottomhole temperatures are encountered which render these chemical inhibitors ineffective. In order to overcome this drawback the downhole tools are sometime coated with nonmetallic coatings such as fused plastic. However, these types of protective coatings are also often rendered ineffective due to the high temperatures and abrasive well fluids. On the other hand, some metallic coatings, such as nickel or chromium alloys, suitably protect against these high temperatures and corrosive fluids. These coatings are made of expensive metals and applied either electrolytically or by spray coating using very high tempertures which significantly lowers the strength of the tools. Additionally these coatings are not diffused into the steel matrix, and therefore no interdiffusion reaction takes place between the base metal and the coating to provide a new intermetallic layer.

In view of these circumstances, it can be appreciated that it is desirable to produce tools which possess exceptional performance characteristics in corrosive environments at much reduced cost than is presently available.

SUMMARY OF THE INVENTION

In accordance with the invention there is provided a method of making an article of aluminized strengthened steel in which a combination of metallurgical processes are coordinated in such a manner as to make an inexpensive ferrous tool with high yield strength together with enhanced corrosion resistance for use downhole in oil and gas wells. The invention comprises several steps:

First, a ferrous tool is provided which is made of carbon or alloy steel having an alloying equivalent composition of from 0.43 weight percent to 0.93 weight percent of the sum of the carbon content and one tenth of the sum of the content of boron, chromium, manganese, molybdenum, nickel, silicon, and vanadium, where the alloy composition is uniformly distributed throughout the metallurgical structure.

Next, the ferrous tool is strengthened by a heat treating process consisting of heating the tool to a temperature above 1341° F. to within the austenitizing temperature range of the carbon or alloy steel for a period of 15 minutes or longer to transform sufficiently the metallurgical structure to face-centered cubic austenite and then to further subsequently cool it rapidly to below 600° F. to transform further the face-centered austenite structure to body-centered tetragonal martensite, thereby hardening the ferrous tool to a minimum of 30 Rockwell C. Next, a treatment comprising tempering the martensitic structure by reheating to reduce residual cooling stresses and toughen the ferrous tool, is done but where the tempering temperature is still maintained below 1341° F. to avoid over-tempering retransformation of the martensitic tetragonal structure.

Finally, the strengthened ferrous tool is aluminized by applying aluminum to its surface either by immersing it in a bath of molten aluminum at a temperature in the range of from 1000° F. to below 1341° F. or by electroplating, thermo spraying, or vapor deposition, and subsequently heating the ferrous tool to such a temperature range to prevent retransforming the body-centered tetragonal martensite structure to the face-centered cubic austenite structure, for a period of more than 5 minutes to sufficiently cause interdiffusion of the aluminum in the bath and the iron in the ferrous tool and to further metallurgically cause to transform the surface and subsurface of the ferrous tool to form an intermetallic layer composed of an alloy of essentially aluminum and iron which is from 0.002 inch to 0.027 inch in thickness and where the aluminizing process is carried out without reducing the yield strength of the steel below 60,000 psi.

It should be noted that the above outlined process may be performed so that some of the steps are combined or performed simultaneously; thus the tool may be heated in molten aluminum to carry out simultaneously either said austenitizing or tempering process to cause interdiffusion of aluminum and iron, forming an intermetallic layer and strengthening the ferrous tool altogether.

In the above outlined process the step of quench-hardening the ferrous tool can further comprise rapidly cooling the tool in air, oil, water or brine, thereby hardening the ferrous tool to a minimum of 30 Rockwell C.

The aluminum which is applied to a ferrous tool surface in accordance with the invention can comprise substantially pure aluminum or aluminum alloy consisting of aluminum and alloying additives therefor selected from the group consisting of antimony, beryllium, boron, bismuth, calcium, chromium, cobalt, copper, gallium, germanium, gold, indium, iron, lead, lithium, magnesium, manganese, nickel, silicon, silver, sodium, tin, and zinc and mixtures thereof.

In accordance with this invention, maintaining the high strength of carbon and low-alloy steels during the aluminizing step can be successful only when coordinated with carefully optimized alloying compositions of the steels used and only when the heat treating and aluminizing steps and parameters have been coordinated with the prescribed chemical compositions in this manner. The strength of the steel achieved by heat treatment can be maintained during the aluminizing step at the same time that the cost of the steel is kept low. It has not been known heretofore that a steel article could be made that would possess high strength and enhanced corrosion resistance without resorting to quite expensive high-alloy metals such as high chromium nickel stainless steels.

An optimum chemical composition of the steel article is one of three very important parts of my invention. The steel article must contain a suitable chemical composition so that the steel will have sufficient martensite formed upon rapid cooling from a temperature above the critical temperature (Acl) of the steel used, so that even after the tempering and aluminizing processes are completed, the yield strength of the steel will still be greater than 60,000 psi. Although the steel article can contain enough alloying elements for the transformation of the austenite to martensite upon rapid cooling and to maintain a high yield strength after aluminizing, the amount of these alloy additions must also be low enough so that the steel article will not be made from expensive materials such as those containing high amounts of chromium and nickel like stainless steels. The following equation which I have developed and called alloying equivalency (AE) gives the optimum chemical composition required for maintaining a yield strength at least 60,000 psi after tempering and aluminizing of the carbon or low alloy steel is completed while also meeting the cost criterion.

The equation is as follows:

$$AE = Carbon + 1/10 (B + Mn + Si + Cr + Mo + V + Ni)$$

(weight percentage) where $0.43\% \leq AE \leq 0.93\%$ is the optimum alloying composition range.

An example of an alloy steel which meets the AE requirement is AISI 4140, which has a minimum specified AE of 0.47%. In the first step, this alloy steel is heat treated by austenitizing at 1550° F. and subsequently rapidly cooled in oil to transform the austenite to martensite. The surface hardness at this point is about 50 Rockwell C and contains about 80% martensite. The second step consists of tempering the steel alloy at about 1250° F. for two hours where the hardness of the steel article after tempering is about 22 Rockwell C and the yield strength is about 100,000 psi. The microstructure of the steel at this point is composed primarily of tempered martensite. The third step comprises aluminizing the steel article at a temperature of about 1300° F. for 30 minutes. The hardness of the steel after this step will be around 20 Rockwell C, and its yield strength is no less than 90,000 psi. If, however, a tool made with carbon steel with an alloy equivalency (AE) of less than 0.43% such as AISI 1030,, is heat treated and aluminized in the same manner, its final hardness is only about 5 Rockwell C, and its yield strength is less than 60,000 psi. Steels with an AE of more than 0.93% would make the article very expensive. An example of an alloy with an AE greater than 0.93% and used extensively to resist corrosion is AISI 410. This stainless steel has a minimum AE of 1.37% and will respond to heat treatment, where its yield strength will be about 60,000 psi after aluminizing at 1300° F. However, its price is six times that of AISI 4140, and yet its yield strength will only be about 70% of AISI 4140. Tools made of both these alloys will have basically the same resistance to corrosive fluids found in oil and gas wells.

The heat treatment of carbon or alloy steels includes elevating the temperature to above its critical transformation point (Acl), which will convert the microstructure to austenite. This structure is basically a face-centered cubic structure and is stable only above the critical temperature (Acl) of the steel. Austenitic transformation in a simple iron-carbon metal usually starts to occur at the eutectoid temperature of approximately 1341° F. and is the temperature where the metallurgical structure changes from ferrite and pearlite to austenite. Below this temperature the metallurgical structure will transform back to soft ferrite, body-centered structure, and pearlite which is composes of ferrite and iron carbide. If cooling is rapid enough, however, to below a certain temperature, the structure will transform to a body-centered tetragonal structure called martensite. This structure is much stronger and harder than either the austenite or ferrite/pearlite structures, but it is also very strained and brittle. Rapid cooling can usually be done in air, oil, water or brine, depending on the chemical composition of the alloy. In order to accomplish the transformation to the body centered tetragonal structure, the steel article must be cooled rapidly enough to below a temperature called Martensite Start (MS). This usually occurs as high as around 600° F. in steels having a composition in the AE range described in this invention. After the steel article has cooled, its hardness will be about 30 Rockwell C or greater. The steel article is then again reheated to a temperature below its critical temperature (Acl) so that the hardened tetragonal martensite will temper, reduce residual strain and increase the steel ductility and toughness. The structure of the steel will be strong and tough and be composed primarily of tempered martensite.

Until the present invention, it has been thought that to produce a thick layer of the intermetallic Al-Fe alloy for improved corrosion resistance of ferrous alloys, it is required that the diffusion step be carried out at a temperature well in excess of 1300° F., generally around 1700° F. to 2000° F. At these temperatures, the strength of quenched and tempered carbon or low alloy steel is rapidly reduced by over-tempering, or is completely removed by the retransformation of martensite to the softer austenite. Because the diffusion rate in metals will increase with an increase in temperature, a high aluminizing temperature is regarded as necessary to form a thick aluminum-iron intermetallic layer as quickly as possible. For example, to form a layer 5 mils thick at 2000° F., the time required is only about two minutes; but to form the same layer at 800° F., the time required is several hours. Therefore, it is more economical to use the higher temperature in the production of aluminized parts. However, if a certain strength level must be maintained in the steel article, the diffusion temperature becomes critical. At 2000° F. the steel article would be reaustenitized and upon slow cooling from the aluminizing process, the martensitic microstructure of the steel would be converted to the weaker ferrite/pearlite structure. In the present invention, however, the steel article is quenched-hardened and tempered to obtain a yield strength greater than 60,000 psi. Then, to prevent retransformation of the martensite, the subsequent aluminizing process is carried out a temperature below the critical temperature of the steel and perferably below 1341° F. In this manner, the aluminizing temperature is not so low as to make production of the aluminized parts uneconomical because of extended aluminizing time. An optimum balance between these two factors is necessary, i.e., an aluminizing temperature below the critical temperature of the steel but still high enough to form a thick intermetallic layer relatively fast. This optimum temperature is in the range of 1000° F. to 1341° F. and with the correct alloy composition, a yield strength of at least 60,000 psi can be maintained in the finished aluminized steel article. Furthermore, the highest temperature the steel article is exposed to after hardening, either through tempering or aluminizing, will dictate the final strength level. Ideally, a steel article could be tempered and aluminized simultaneously as long as the final yield strength is 60,000 psi or greater and the intermetallic layer is 0.002 inch or thicker. A steel article meeting the AE requirement can be made according to this invention and possess a minimum yield strength of 60,000 psi, have enhanced corrosion resistance and cost considerably less than highly alloyed materials, such as stainless steels.

If a steel part is strengthened after aluminizing, the intermetallic layer would crack and be rendered useless for corrosion protection purposes. The intermetallic layer is extremely hard and brittle and will respond to rapid changes in temperature by cracking. In the present invention, however, the aluminizing temperature is coordinated with the strengthening heat treatment so that the yield strength of the steel will be higher than can be achieved in the conventional aluminizing process and the intermetallic layer will be intact to provide corrosion protection.

The principle of corrosion protection involved in the present invention is in arresting the oxidation or sulfidation of the metal being attacked. In aluminum, the inherent corrosion resistance is due to the formation of a layer of aluminum oxide. This layer is extremely stable chemically, and it will not break down under many conditions corrosive to steel. These include high temperature and environments of hydrogen sulfide and carbon dioxide found in oil and gas wells. If the aluminum oxide layer is tightly adhered on the steel surface, then corrosion attack is greatly reduced or even eliminated. However, in order to form the aluminum oxide, aluminum metal must be available to continuously maintain and replenish the formation of the aluminum oxide. But aluminum metal is soft and will weaken greatly at high temperatures. At 400° F. the yield strength of aluminum is only 50% of its original strength at ambient temperature and the metal is not hard and will scrape off, wear off, and abrade very easily. Its adherence and tenacity to bond on to the steel surface is also very weak. On the other hand, the aluminum-iron intermetallic layer provided by the present invention is more durable and abrasive resistant than aluminum. This layer is ten times harder than aluminum and is three to four times harder than the steel. In addition, the Al-Fe intermetallic layer in the steel article continually provides a protective aluminum oxide which resists environments normally hostile to steel.

Accordingly, a primary object of the present invention is to provide a process by which tools or components made of carbon or alloy steels in which optimized alloying compositions can be heat treated to increase the yield strength and subsequently or simultaneously aluminized in a manner which produces an intermetallic layer to be formed in the steel matrix while maintaining the yield strength at 60,000 psi or greater.

Another, and still further, object of the present invention is the provision of a process for making tools from carbon or alloy steels which can withstand load stresses and corrosive conditions in a superior manner.

A further object of this invention is to provide a process for making downhole tools, such a sucker rods and pump components, wherein the tool is heat treated, covered with aluminum, again heat treated to interdiffuse the aluminum metal with the iron matrix of the tool, to form thereby, an inherently heat and corrosion resistant, high strength downhole tool.

A still further object of the invention is to provide a manufacturing process by which the strengthened tool is metallurgically altered to provide an aluminum-iron intermetallic alloy which resists environments normally corrosive to carbon or alloy steels.

Another and still further object of this invention is the method of manufacturing by which a sucker rod is provided with enhanced corrosion protection, by covering the exterior of the rod with aluminum metal, subjecting the rod to 1000° F. or higher but below 1341° F., whereupon the aluminum is interdiffused with the iron in the subsurface of the rod to thereby form an intermetallic layer which resists abrasive wear and corrosive fluids.

The following are examples of the production of low cost tools according to the present invention and where high strength and enhanced corrosion resistance are a great advantage:

EXAMPLE I

The barrel of a subsurface pump is manufactured of AISI 1040 carbon steel with a minimum AE of 0.45%, and heat treated by austenitizing at a temperature of 1550° F. for one hour, and then rapidly water quenched and cooled to room temperature. The strengthened barrel is subsequently tempered at 1300° F. for one hour to further toughen the carbon steel. Its yield strength at this point is 62,000 psi. The cleaning process consists of grit blasting with 25 to 40 mesh size garnet using about 80 psi air pressure to remove dirt, scale and other foreign objects. The barrel is placed in a basket with other barrels and chemically cleaned with suitable degreasing solvent to further remove all traces of oil or grease and moisture. The basket of barrels is then moved to the aluminizing section where a container made of refractory brick and containing molten aluminum is made available. The molten aluminum is heated above its melting point, and preferably to about 1300° F., by the use of induction heating. After the molten aluminum has been skimmed, the basket of barrels is dipped into the container of molten aluminum and held below the surface thereof for 40 minutes. This time interval allows the molten aluminum to completely cover the barrel surfaces and simultaneously interdiffuses aluminum into the carbon steel thereby to form the intermetallic layer of aluminum-iron alloy which is 0.005 inch thick. The basket is next extracted from the molten aluminum, shaken, and air-blasted to remove excess aluminum. The parts are then cooled in water and air-dried. The final yield strength will be not less than 60,000 psi.

EXAMPLE II

A packer component made of AISI 8740 with a minimum AE of 0.58% is to be used downhole in a wellbore which contains hot corrosive fluids. The packer component is placed in a heat treating furnace maintained at a temperature of 1525° F. and austenitized for one hour. The parts are then quenched in oil to harden the steel alloy. The components are then degreased and grit blasted and are then dipped into a molten aluminum bath maintained at 1300° F. for two hours to simultaneously temper the martensite and to interdiffuse the aluminum and iron to make one intermetallic layer about 0.009 inch thick. This process provides a packer part with a new layer of aluminum-iron alloy which is an integral part of the packer slip component and which also possess high strength. The typical mechanical properties are as follows:

Hardness about 22 Rockwell C;
Tensile strength 115,000 psi;
Yield strength 95,000 psi;
Intermetallic layer thickness about 0.009 inch;
Intermetallic layer hardness about 700 DPH.

EXAMPLE III

A sucker rod is manufactured from AISI 4150 which meets the alloying equivalency (AE) requirements, is formed and forged at the ends according to API specification IIB and is subsequently heat treated by austenitizing the alloy to about 1550° F., and held for one hour at this temperature. The sucker rod is subsequently quenched in oil to rapidly cool to below 600° F., and held for one hour at this temperature. The hardness of the sucker rod at the end of this step is about 50 Rockwell C. The rod is then again reheated by tempering at 1250° F. for about two hours in order to further toughen the steel alloy. The hardness of the rod after cooling is about 25 Rockwell C.

After the heat treatment is completed, the rod is next cleaned by grit blasting, to white metal. The air use for grit blasting is clean and uncontaminated by water or oil, and is pressured to about 80 psi in order to permit good removal of scale. A subsequent solvent cleaning further removes water, grease and oil. After the sucker rod surface has been properly cleaned, it is then sprayed with atomized aluminum alloy 1100 using two thermal spray guns. The aluminum wire is melted by the intense heat provided by the thermal spraying and is impacted against the sucker rod surface. This results in a layered aluminum coating about 10 mils thick, which exhibits a density of about 90%. The sprayed sucker rod is reheated in a salt-bath furnace to a temperature of about 1300° F. for about one hour. This causes the aluminum to coalesce and homogenize to almost 100% density. More importantly however, at this temperature the aluminum adjacent to the steel rod surface interdiffuses with the iron in the alloy steel matrix and forms the intermetallic layer comprised of an aluminum-iron alloy. After completion of the diffusion process, the new intermetallic layer is about 3 mils thick. The sucker rods are the next visually inspected to ensure that the entire surface has been processed and also to check the dimensional requirements. The mechanical properties attained in the 4150 rod exhibit these final characteristics:

AE = 0.67%

Hardness is approximately 25 Rockwell C;
Tensile strength is about 120,000 psi;
Yield strength is about 100,000 psi;
Intermetallic layer hardness is about 700 DPH:
Intermetallic layer thickness is about 0.003 inch.

What is claimed:

1. A method of making an article of strengthened steel comprising a combination of metallurgical processes coordinated in such a manner as to make an inexpensive ferrous article with high yield strength together with enhanced corrosion resistance especially for use as a tool downhole in oil and gas wells, the method comprising the steps of:
   (a) providing a ferrous article which is made of carbon or alloy steel having an alloying equivalent composition of from 0.43 weight percent to 0.93 weight percent of the sum of the carbon content and one tenth of the sum of the content of boron, chromium, manganese, molybdenum, nickel, silicon, and vanadium, where the alloy composition is uniformly distributed throughout the metallurgical structure;
   (b) strengthening the said ferrous article by a heat treating process consisting of heating the article to a temperature above 1341° F. to within the austenitizing temperature range of the carbon or alloy steel for a period of 15 minutes or longer in order to transform sufficiently the metallurgical structure to face-centered cubic austenite and then further subsequently cooling rapidly to below 600° F. in order to transform the face-centered austenite structure to body-centered tetragonal martensite thereby hardening the ferrous article to a minimum of 30 Rockwell C and further comprising tempering the martensitic structure by reheating in order to reduce residual cooling stresses and toughen the ferrous article, but where the tempering temperature is still maintained below 1341° F. in order to avoid over-tempering retransformation of the martensitic tetragonal structure to face-centered cubic austenite;
   (c) aluminizing the strengthened ferrous article by applying aluminum to its surface and simultaneously or thereafter heating said to a temperature in the range of from 1000° F. to below 1341° F. to prevent retransforming the body-centered tetragonal martensite structure to face-centered cubic austenite structure, for a period of more than 5 minutes in order to sufficiently cause interdiffusion of the applied aluminum and the iron in the ferrous article and in order to further metallurgically cause to transform the surface and subsurface of the ferrous article to form an intermetallic layer composed of an alloy of essentially aluminum and iron which is from 0.002 inch to 0.027 inch in thickness and where the aluminizing process is carried out without reducing the yield strength of the steel below 60,000 psi.

2. A method in accordance with claim 1 in which said aluminum is applied to the surface of said article in a bath of molten aluminum at a temperature in the range of from 1000° F. to below 1341° F.

3. A method in accordance with claim 1, in which the step of applying aluminum to a ferrous article surface is done by carrying out on the following: electroplating, thermospraying, or vapor deposition; and subsequently heating the ferrous article to cause interdiffusion of the deposited aluminum and the iron thereby forming an intermetallic layer composed of aluminum-iron alloy.

4. A method in accordance with claim 1 wherein the article is heated in molten aluminum to carry out simultaneously either an austenitizing or tempering process and to cause interdiffusion of aluminum and iron, forming an intermetallic layer and strengthening the ferrous tool altogether.

5. A method in accordance with claim 1, whereby the process of quench-hardening the ferrous article in air, oil, water or brine, thereby hardening the ferrous article to a minimum of 30 Rockwell C.

6. A method in accordance with claim 1 whereby the step of applying aluminum to said ferrous article surface comprises applying substantially pure aluminum or aluminum alloy consisting of aluminum and alloying additives thereof selected from the group consisting of antimony, beryllium, boron, bismuth, calcium, chromium, cobalt, copper, gallium, germanium, gold, indium, iron, lead, lithium, magnesium, manganese, nickel, silicon, silver, sodium, tin, zinc, and mixtures thereof.

* * * * *